(12) United States Patent
Verghese et al.

(10) Patent No.: US 12,234,552 B2
(45) Date of Patent: Feb. 25, 2025

(54) SEMICONDUCTOR PROCESSING APPARATUS AND METHODS FOR MONITORING AND CONTROLLING A SEMICONDUCTOR PROCESSING APPARATUS

(71) Applicant: ASM IP Holding B.V., Almere (NL)

(72) Inventors: Mohith Verghese, Phoenix, AZ (US); Todd Dunn, Cave Creek, AZ (US); John Kevin Shugrue, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 155 days.

(21) Appl. No.: 18/131,170

(22) Filed: Apr. 5, 2023

(65) Prior Publication Data

US 2023/0243033 A1    Aug. 3, 2023

Related U.S. Application Data

(62) Division of application No. 15/917,224, filed on Mar. 9, 2018, now Pat. No. 11,629,406.

(51) Int. Cl.
| | | |
|---|---|---|
| *C23C 16/455* | (2006.01) | |
| *C23C 16/46* | (2006.01) | |
| *C23C 16/52* | (2006.01) | |

(52) U.S. Cl.
CPC ........ *C23C 16/45544* (2013.01); *C23C 16/46* (2013.01); *C23C 16/52* (2013.01)

(58) Field of Classification Search
CPC ......... H01L 21/67739; H01L 21/67745; H01L 21/67754; C23C 16/45544; C23C 16/46; C23C 16/52

See application file for complete search history.

(56) References Cited

U.S. PATENT DOCUMENTS

| | | |
|---|---|---|
| 5,259,881 A | 11/1993 | Edwards et al. |
| 6,190,037 B1 | 2/2001 | Das et al. |

(Continued)

FOREIGN PATENT DOCUMENTS

| | | |
|---|---|---|
| KR | 20000066176 A | 11/2000 |
| KR | 20090126054 A | 12/2009 |

(Continued)

*Primary Examiner* — Michael P Wieczorek

(74) *Attorney, Agent, or Firm* — Snell & Wilmer L.L.P.

(57) ABSTRACT

A semiconductor processing apparatus is disclosed. The apparatus may include a multiple chamber module comprising at least a first reaction chamber and a second reaction chamber, and a first substrate support structure disposed within the first reaction chamber and a second substrate support structure disposed within the second reaction chamber. The apparatus may also include a wafer handling chamber comprising a transfer robot configured for transferring two or more substrates along a first transfer path between the wafer handling chamber and the first substrate support structure and a second transfer path between the wafer handling chamber and the second substrate support structure. The apparatus may also include at least a first pyrometer and a second pyrometer, wherein a first optical path of the first pyrometer intersects the first transfer path and a second optical path of the second pyrometer intersect the second transfer path. Methods of monitoring and controlling a semiconductor processing apparatus are also disclosed.

20 Claims, 6 Drawing Sheets

(56) References Cited

U.S. PATENT DOCUMENTS

| | | |
|---|---|---|
| 2009/0000769 A1 | 1/2009 | Lin et al. |
| 2010/0111648 A1 | 5/2010 | Tamura et al. |
| 2011/0186762 A1 | 8/2011 | Geiser |
| 2011/0265951 A1* | 11/2011 | Xu .................. C23C 16/46 |
| | | 118/712 |
| 2016/0056032 A1 | 2/2016 | Baldasseroni et al. |
| 2017/0067163 A1* | 3/2017 | Papasouliotis .......... C23C 16/50 |
| 2017/0081764 A1 | 3/2017 | Aburatani et al. |
| 2017/0114457 A1 | 4/2017 | Hirochi |

FOREIGN PATENT DOCUMENTS

| | | |
|---|---|---|
| KR | 20150035293 A | 4/2015 |
| KR | 101620545 B1 | 5/2016 |

\* cited by examiner

SEMICONDUCTOR PROCESSING APPARATUS AND METHODS FOR MONITORING AND CONTROLLING A SEMICONDUCTOR PROCESSING APPARATUS

CROSS-REFERENCE TO RELATED APPLICATIONS

This application is a divisional of, and claims priority to and the benefit of, U.S. patent application Ser. No. 15/917,224, filed Mar. 9, 2018 and entitled "SEMICONDUCTOR PROCESSING APPARATUS COMPRISING ONE OR MORE PYROMETERS FOR MEASURING A TEMPERATURE OF A SUBSTRATE DURING TRANSFER OF THE SUBSTRATE," which is hereby incorporated by reference herein.

FIELD OF INVENTION

The present disclosure relates generally to a semiconductor processing apparatus and in particular to a semiconductor processing apparatus comprising a multiple chamber module. The disclosure also generally relates to methods for monitoring and controlling a semiconductor processing apparatus.

BACKGROUND OF THE DISCLOSURE

Reaction chambers may be used for depositing various material layers onto semiconductor substrates. A semiconductor substrate, such as, for example, a silicon substrate, may be placed on substrate support structure inside a reaction chamber. Both the substrate and the substrate support structure may be heated to a desired substrate temperature set point. In an example substrate treatment process, one or more reactant gases may be passed over a heated substrate, causing the deposition of a thin film of material on the substrate surface. Throughout subsequent deposition, doping, lithography, etch, and other processes, these layers are made into integrated circuits.

Various process parameters may be carefully controlled to ensure the high quality of the deposited layers. An example of one such process parameter is the substrate temperature. For example, during an atomic layer deposition (ALD) process, the precursor gases may interact with the substrate within a particular temperature range for deposition on the substrate. A change in the temperature may result in a change in a deposition rate and an undesirable layer thickness. Accordingly, it is important to accurately control the substrate temperature to bring the substrate to a desired deposition temperature before treatment begins and to maintain the desired temperature throughout the deposition process.

A semiconductor processing apparatus may comprise two or more reaction chambers contained in a common housing, i.e., a multiple chamber module, wherein the two or more reaction chambers are nominally identical to one another. For example, an atomic layer deposition system may comprise a dual chamber module consisting of a first reaction chamber and a second reaction chamber. Although the two or more reaction chambers making up the multiple chamber module may be nominally identical, there may be some variance from reaction chamber to reaction chamber. For example, the reaction chambers utilized in atomic layer deposition processes may each have a characteristic thermal environment which may in turn affect the substrate temperature during a deposition process. The reaction chambers may be fabricated from metals and metal alloys. Processes utilized in the fabrication of the reaction chambers may result in the variation of features of the reaction chamber, such as, for example, critical dimensions, material quality, etc. In addition, the components within and surrounding the reaction chambers may vary in position and optimal function, adding additional variance. In addition, the thermal environment within a reaction chamber may change over the period of a number of deposition processes. For example, a portion of the deposited material may accumulate on the surface of the walls of the reaction chamber and alter the surface properties of the walls of the reaction chamber, e.g., the emissivity of the chamber walls may change over a time period.

The variation in the reaction chambers may be undesirable for high volume manufacturing wherein multiple chamber modules may perform the same process recipe with the expectation that the process results are essentially identical. For example, in an atomic layer deposition process, the resulting deposited layers are expected to possess uniform thickness, carrier mobility, refractive indices, stress, etc.

To overcome the problems which may arise due to variations in reaction chambers, processes known as "chamber matching" may be employed. However, existing "chamber matching" processes may be time consuming, cost prohibitive and may not provide effective apparatus and methods for monitoring and controlling a semiconductor processing apparatus comprising a multiple chamber module. Accordingly, apparatus and methods are desired for overcoming the problems associated with the variation in reaction chambers in a semiconductor processing apparatus comprising a multiple chamber module.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, a semiconductor processing apparatus is provided. The apparatus may comprise: a multiple chamber module comprising at least a first reaction chamber and a second reaction chamber; a first substrate support structure disposed in the first reaction chamber and a second substrate support structure disposed in the second reaction chamber. The apparatus may further comprise: a wafer handling chamber comprising a transfer robot configured for transferring two or more substrate along a first transfer path between the wafer handling chamber and the first substrate support structure and a second transfer path between the wafer handling chamber and the second substrate support structure; and at least a first pyrometer and a second pyrometer, wherein a first optical path of the first pyrometer intersects the first transfer path and a second optical path of the second pyrometer intersects the second transfer path.

In some embodiments of the disclosure, a method of monitoring and controlling a semiconductor processing apparatus is provided. The method may comprise: heating two or more substrates to a process temperature in a multiple chamber module; transferring the two or more substrates from the multiple chamber module to a wafer handling chamber; and measuring the temperature of the two or more substrates concurrently with transferring the two or more substrates.

For the purpose of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF EXEMPLARY EMBODIMENTS

Figure 1:
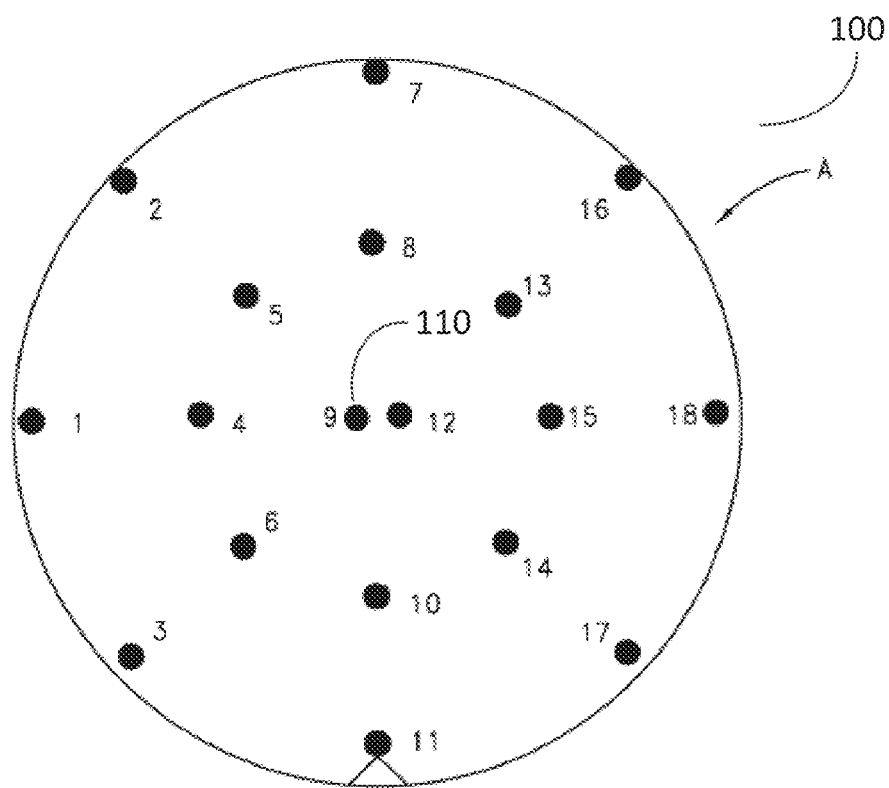
FIG. 1 is a schematic diagram of an example instrumented wafer comprising an array of thermocouples.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, apparatus, structure, or device, but are merely idealized representations that are used to describe embodiments of the disclosure.

As used herein, the term "substrate" may refer to any underlying material or materials that may be used, or upon which, a device, a circuit or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "multiple chamber module" may refer to a single common housing comprising two or more reaction chambers, configured for processing substrates, disposed closely to each other and viewed substantially as, e.g., positionally, structurally, functionally, and/or operationally, separated or isolated from each other. The two or more reaction chambers may be disposed side by side or vertically in the single common housing.

As used herein, the term "pyrometer" may refer to an optical or radiant device that can measure temperature in a non-contact manner based on radiant energy.

As used herein, the term "transfer path" may refer to a route, transcribed by a moving substrate, as it transferred from a first location to a second location. The "transfer path" may have a width corresponding to the width of the substrate and a length corresponding to the distance travelled between the first location and the second location.

As used herein, the term "optical path" may refer to the path along which electromagnetic radiation, i.e., radiant energy, propagates.

The embodiments of the disclosure may include semiconductor processing apparatus and methods that may be utilized for monitoring the temperature of two or more reaction chambers associated with a multiple chamber module of a semiconductor processing apparatus. The apparatus and methods may also comprise acquiring thermal data from the two or more reaction chambers and utilizing the thermal data to control the thermal environment within the two or more reaction chambers such that a control system may substantially match the temperature of the substrates disposed in at least a first reaction chamber and a second reaction chamber. The apparatus and methods may allow for the thermal calibration of the two or more reaction chamber such that a substantially identical thermal environment may be generated between two or more reaction chambers, thereby permitting the use of identical process recipes across multiple reaction chambers with corresponding uniformity in process results.

The semiconductor processing apparatus of the current disclosure may comprise at least two pyrometers configured for measuring the temperature of two or more substrates simultaneously as the substrates are transferred from substrate support structures to a wafer handling chamber. The semiconductor processing apparatus may also include a control system for acquiring and storing the temperature data from the substrates such that the thermal environment within the reaction chambers of the multiple chamber module may be monitored over time. The control system may also be arranged in a feedback configuration with the heaters associated with the reaction chambers such that the temperature data may be utilized to substantially match the temperature between two substrates disposed in a first reaction chamber and a second reaction chamber respectively.

Methods known in the art for the thermal monitoring and/or calibration of reaction chambers may utilize an instrumented wafer. In more detail and with reference to FIG. 1, an instrumented wafer 100 may comprise a wafer in which an array of calibrated thermocouples has been attached. For example, as illustrated in FIG. 1, the instrumented wafer 100 may comprise calibrated thermocouples 1-18 attached to a wafer, including center thermocouple 110. The thermal monitoring and/or calibration of reaction chambers may require the installation of the instrumented wafer into the reaction chambers and subsequently measuring of the temperature across the instrumented wafer at the positions corresponding to the attached thermocouples. Instrumented wafers may be useful as it is possible to screen a relatively wide parameter space (temperature, pressure, carrier gas flow, etc.) within the reaction chamber and minimize the within wafer temperature non-uniformities.

However, the thermal monitoring and/or calibration of reaction chambers utilizing an instrumented wafer may be undesirable for a number of reasons. The installation of the instrumented wafer into two or more reaction chambers may be costly, both in terms of the labor hours required and in the materials costs incurred. The utilization of an instrumented wafer may also introduce a potential source of hardware assembly errors, both in the installation of the instrumented wafer, but also in the removal of the instrumented wafer and the requirement to disassemble/assemble portions of the semiconductor processing apparatus. In addition, the installation and subsequent removal of the instrumented wafer may impose a lengthy period of time, between about 12 to 20 hours, for "dry-down time", i.e., the period of time required for the removal of contaminating moisture from the reaction chamber. Although recent advances in instrumented wafer technology has introduced wireless temperature monitoring, such wireless instrumented wafers are prohibitively expensive, have a limited lifetime, and a limited operating temperature, making such wireless instrumented wafers undesirable for continuous thermal monitoring and control of reaction chambers.

The embodiments of the current disclosure may provide a semiconductor processing apparatus. In some embodiments of the disclosure, the semiconductor processing apparatus may include: a multiple chamber module, comprising at least a first reaction chamber and a second reaction chamber. In some embodiments, a first substrate support structure may be disposed in the first reaction chamber and a second substrate support structure may be disposed in the second reaction chamber. In some embodiments, the semiconductor processing apparatus may also comprise, a wafer handling chamber comprising a transfer robot configured for transferring two or more substrates along a first transfer path between the wafer handling chamber and the first substrate support structure and a second transfer path between the wafer handling chamber and the second substrate support structure. In some embodiments, the semiconductor processing apparatus may also comprise, at least a first pyrometer and a second pyrometer, a first optical path of the first pyrometer intersecting the first transfer path and a second optical path of the second pyrometer intersecting the second transfer path.

Figure 2:
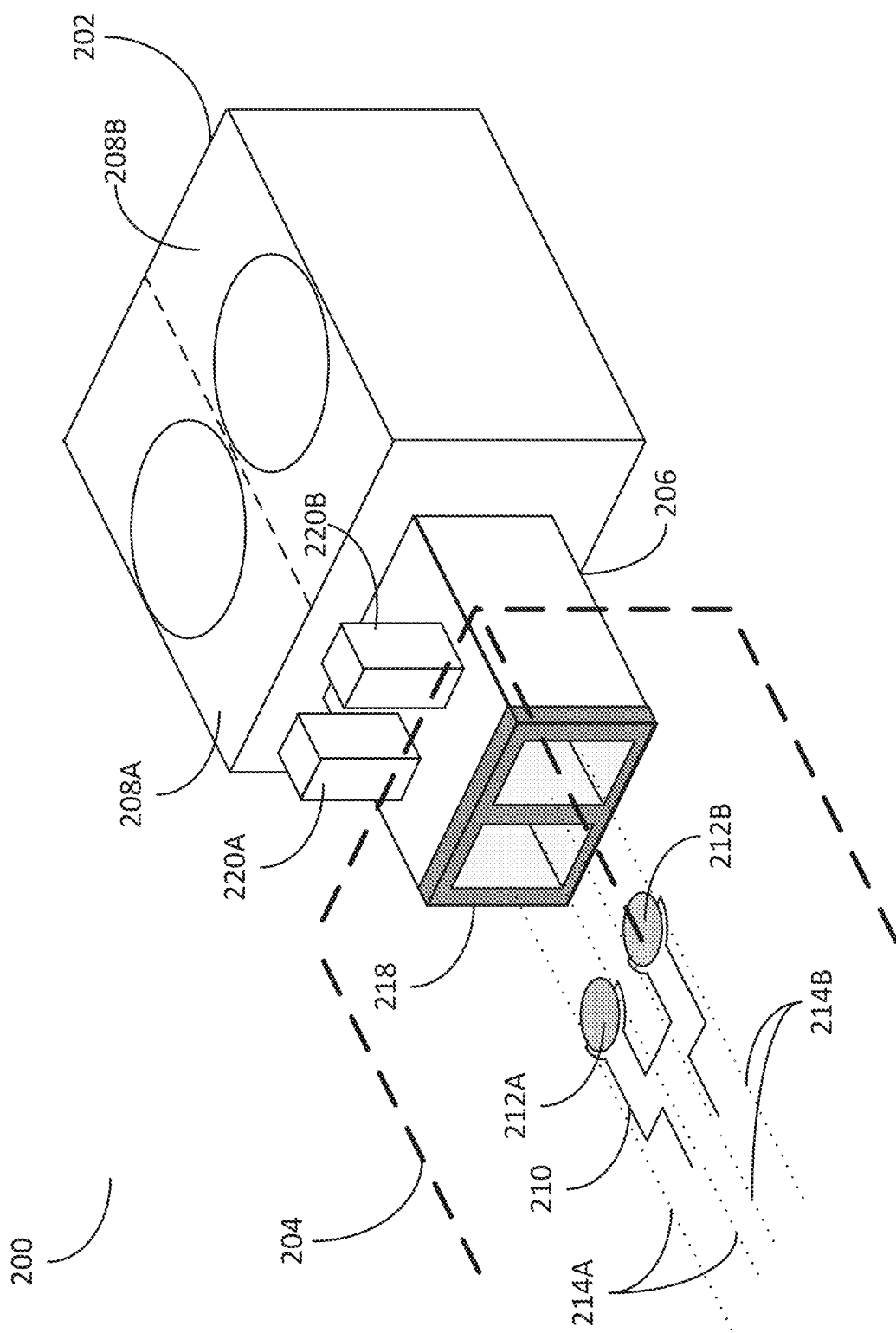
FIG. 2 is a three-dimensional schematic diagram of an exemplary semiconductor processing apparatus according to the embodiments of the disclosure.
Figure 3:
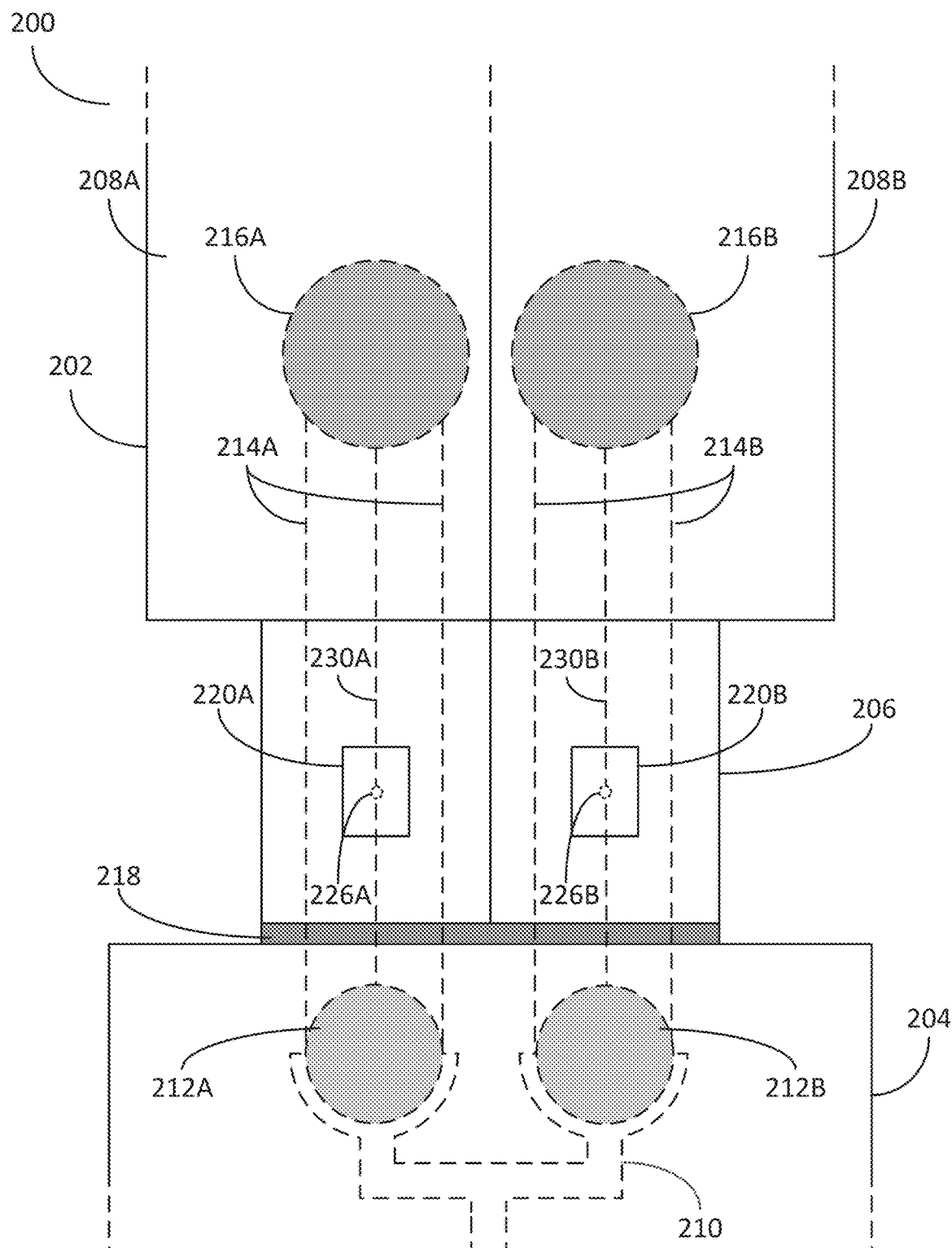
FIG. 3 is a plan-view schematic diagram of an exemplary semiconductor processing apparatus according to the embodiments of the disclosure.
Figure 4:
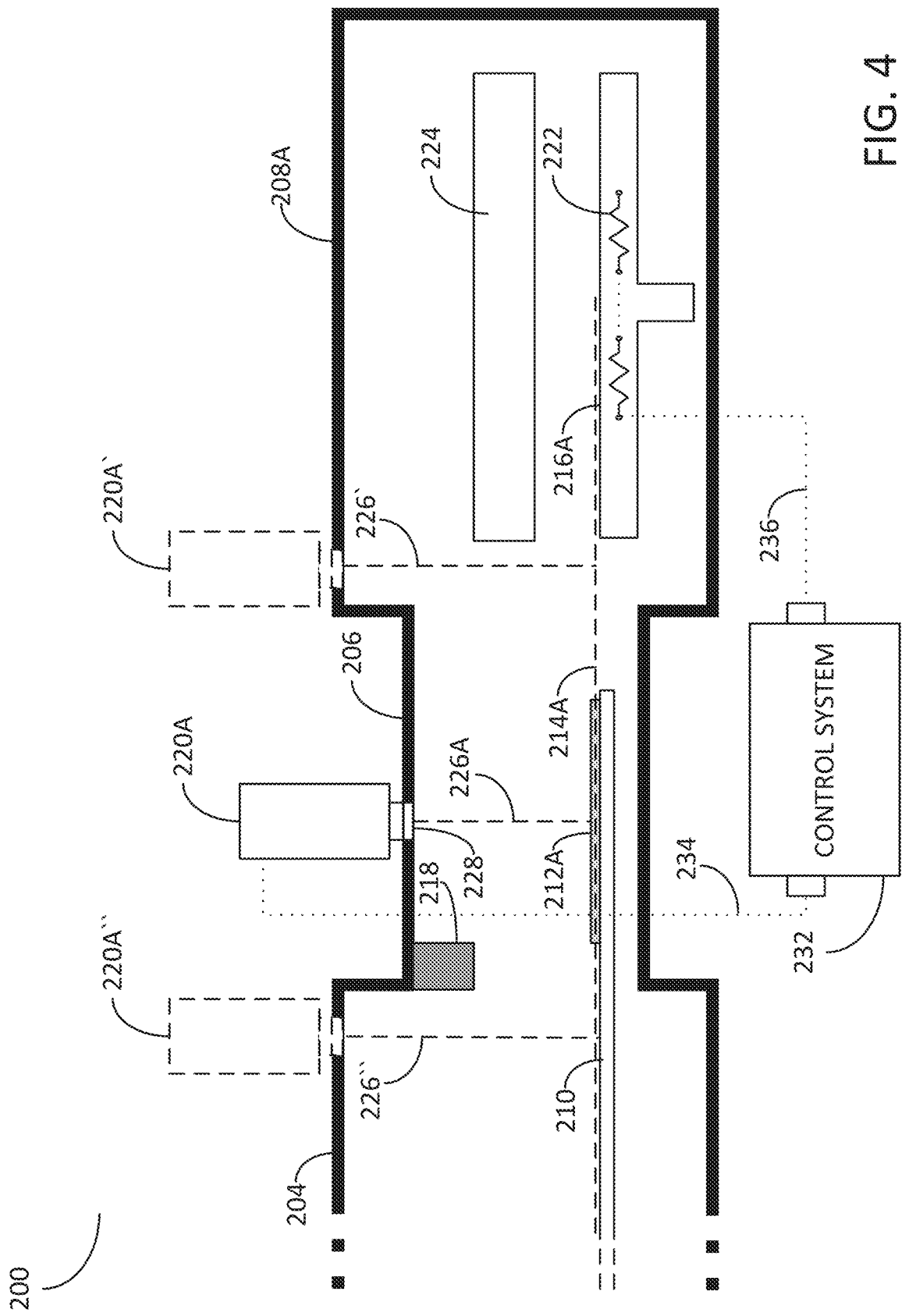
FIG. 4 is a cross-sectional view schematic diagram of an exemplary semiconductor processing apparatus according to the embodiments of the disclosure.

The semiconductor processing apparatus of the disclosure is illustrated in FIGS. 2-4, wherein FIG. 2 illustrates a three-dimensional illustration of the semiconductor processing apparatus 200, FIG. 3 illustrates a plan view of the semiconductor processing apparatus 200, and FIG. 4 illustrates a cross sectional view of the semiconductor processing apparatus 200. Common elements featured in FIGS. 2-4 are labelled with the same reference labels and reference to FIGS. 2-4 may be made when describing the embodiments of the semiconductor processing apparatus of the current disclosure. It should be noted that the semiconductor processing apparatus 200 illustrated in FIGS. 2-4 are simplified schematic versions of the semiconductor processing apparatus and do not contain each and every element, i.e., such as each and every valve, gas line, and reactor component, etc., that may be utilized in the fabrication of the semiconductor processing apparatus of the current disclosure. The semiconductor processing apparatus as illustrated in FIGS. 2-4 provide the key features of the semiconductor processing apparatus to provide sufficient disclosure to one skilled in the art to appreciate the embodiments of the current disclosure.

In more detail and with reference to FIG. 2, the embodiments of the disclosure may comprise a semiconductor processing apparatus 200 including a multiple chamber module 202, a wafer handling chamber (partially illustrated by dashed line 204), and a tunnel structure 206 disposed between the multiple chamber module 202 and the wafer handling chamber 204. In some embodiments of the disclosure, the multiple chamber module 202 may comprise two or more reaction chambers housed in a common housing. For example, the multiple chamber module 202 may comprise a dual chamber module comprising, a first reaction chamber 208A and a second reaction chamber 208B. In some embodiments, the multiple chamber module 202 may comprise three or more reaction chambers, or four or more reaction chambers, or even five or more reaction chambers. In some embodiments of the disclosure, the first reaction chamber 208A and the second reaction chamber 208B may comprise reaction chambers configured for atomic layer deposition process. In some embodiments, the first reaction chamber 208A and the second reaction chamber 208B may comprise reaction chambers configured for chemical vapor deposition processes. In some embodiments, the first reaction chamber 208A and the second reaction chamber 208B may comprise reaction chambers configured for substrate cleaning processes.

In some embodiments of the disclosure, the semiconductor processing apparatus 200 may comprise a wafer handling chamber 204. Note, the wafer handling chamber 204, as illustrated in FIG. 2, is presented in a transparent mode to better demonstrate the internal features associated with the wafer handling chamber 204. The wafer handling chamber 204 may comprise a transfer robot 210, such as, for example, a double-arm transfer robot configured for transferring at least a first substrate 212A and a second substrate 212B from a first location to a second location. For example, the transfer robot 210 may transfer the first substrate 212A and the second substrate 212B between the wafer handling chamber 204 and the multiple chamber module 202. In some embodiments, the transfer robot 210 may be configured for transferring the first substrate 212A and the second substrate 212B between the wafer handling chamber 204 and the multiple chamber module 202 simultaneously, in other words, the first substrate 212A and the second substrate 212B and are transferred at the same time between the wafer handling chamber 204 and the multiple chamber module 202.

In some embodiments of the disclosure, the transfer robot 210 may be configured for transferring the first substrate along a first transfer path and for transferring the second substrate along a second transfer path. In more detail, a transfer path may be defined by the route transcribed by a substrate, as the substrate is transferred from a first location to a second location. For example, a transfer path may have a width corresponding to the width of the substrate and a length corresponding to the distance travelled between the first location and the second location. In some embodiment of the disclosure, a first substrate 212A may be transferred along a first transfer path 214A and a second substrate 212B may be transferred along a second transfer path 214B. FIG. 2 only illustrates a portion of the first transfer path 214A and the second transfer path 214B, for an unrestricted illustration of the first transfer path 214A and the second transfer path 214B reference is made to FIG. 3.

FIG. 3 illustrates a plan view of the semiconductor processing apparatus 200 wherein certain apparatus features are presented by dashed lines to indicate that such features are internal to the semiconductor processing apparatus. As illustrate in FIG. 3 the semiconductor processing apparatus may comprise a wafer handling chamber 204, including transfer robot 210, and a multiple chamber module 202, wherein the multiple chamber module 202 includes a first reaction chamber 208A and a second reaction chamber 208B. In some embodiments of the disclosure, a first substrate support structure 216A may be disposed within the first reaction chamber 208A and a second substrate support structure 216B may be disposed within the second reaction chamber 208B. As illustrated in FIG. 3, in some embodiments, a tunnel structure 206 may be disposed between the multiple chamber module 202 and the wafer handling chamber 204, wherein a gate valve 218 may be utilized to isolate the multiple chamber module 202 from the wafer handling chamber 204. In some embodiments of the disclosure, the tunnel structure 206 may be affixed to a sidewall of the multiple chamber module 202. In some embodiments, the gate valve 218 may comprise two separate gate mechanisms such that first reaction chamber and the second reaction chamber may be independently isolated.

FIG. 3 illustrates a first transfer path 214A, as transcribed by a first substrate 212A, as the first substrate 212A is transferred from the first substrate support structure 216A to the wafer handling chamber 204, and a second transfer path 214B, as transcribed by a second substrate 212B, as the second substrate 212B is transferred from the second substrate support structure 216B to the wafer handling chamber 204. In some embodiments of the disclosure, the first transfer path 214A may extend between the wafer handling chamber 204 and the first substrate support structure 216A, and the second transfer path 214B may extend between the wafer handling chamber 204 and a second substrate support structure 216B. In some embodiments of the disclosure, the lengths of the first transfer path 214A and the second transfer path 214B may be the same, as depicted in FIG. 3. The first transfer path 214A and second transfer path 214B may be disposed within and through tunnel structure the 206, as depicted in FIGS. 2-4. In some embodiments of the disclosure, the transfer robot 210 may comprise a double-arm transfer robot, which may be configured for transferring a first substrate 212A along a first transfer path 214A while simultaneously transferring a second substrate 212B along a second transfer path 214B.

As illustrated in FIGS. 2-4, the semiconductor processing apparatus 200 may also comprise at least a first pyrometer 220A and a second pyrometer 220B. As known in the art, a pyrometer is a type of non-contact (i.e., remote) temperature sensor that may be utilized to determine the temperature of a target surface, such as the surface of a semiconductor substrate. A pyrometer may include an optical system that focuses the radiation of a target surface along an optical path into the detection system of the pyrometer. In some embodiments of the disclosure, a first optical path of the first pyrometer may intersect the first transfer path and a second optical path of the second pyrometer may intersect the second transfer path. In some embodiments of the disclosure, multiple pyrometers may be utilized to measure the surface temperature of the substrates as they are transferred from the substrate support structures to the wafer handling chamber; for example, the semiconductor processing apparatus 200 may comprise two or more pyrometers, or three or more pyrometers, or four of more pyrometers, or even five or more pyrometers.

FIG. 4 illustrates a cross sectional view of semiconductor processing apparatus 200. The semiconductor processing apparatus 200 includes a first reaction chamber 208A, a wafer handling chamber 204, and a tunnel structure 206 disposed between the first reaction chamber 208A and the wafer handling chamber 204. It should be noted that although FIG. 4 illustrates a cross sectional view including a first reaction chamber 208A, a first substrate support structure 216A, a first transfer path 214A, and a first pyrometer 220A, the following description may equally be applied to a second reaction chamber, a second substrate support structure, a second transfer path, and a second pyrometer.

In more detail and with reference to FIG. 4, the first reaction chamber 208A may comprise a first substrate support structure 216A. The first substrate support structure 216A may also include a heating system 222 for providing heat to a substrate supported by the first substrate support structure 216A. In some embodiments, the heating system 222 may comprise an electrical heating systems configured for heating the substrate to a desired substrate temperature set point. The first reaction chamber 208A may also comprise a showerhead 224, wherein the showerhead 224 may be configured for distributing one or more precursor gases over the surface of a substrate supported on the first substrate support structure 216A. It should be noted that the showerhead 224 in FIG. 4 is shown in block form; however, the showerhead 224 may be a relatively complex structure and may be designed to mix precursors from multiple sources, such as at least a precursor source and a carrier/purge gas source, prior to distributing the gas mixture into the first reaction chamber 208A.

The semiconductor processing apparatus as illustrated in FIG. 4, also comprises a wafer handling chamber 204, which includes a transfer robot 210 configured for transferring substrates between the wafer handling chamber 204 and the first reaction chamber 208A in particular to the first substrate support structure 216A. In some embodiments of the disclosure, the semiconductor processing apparatus as illustrated in FIG. 4 may also comprise, a tunnel structure 206, which may include a gate valve 218 (illustrated in the open position) and a first pyrometer 220A. In some embodiments of the disclosure, the first pyrometer 220A may comprise a first optical path 226A, wherein the first optical path 226A intercepts the first transfer path 214A between the wafer handling chamber 204 and the first substrate support structure 216A. Equally, in some embodiments of the disclosure, the second pyrometer may comprise a second optical path, wherein the second optical path intercepts the second transfer path between the wafer handling chamber and the second substrate support structure.

As illustrated in FIGS. 2-4, in some embodiments of the disclosure, at least the first pyrometer 220A and the second pyrometer 220B may be disposed in a ceiling of the tunnel structure 206. For example, the tunnel structure 206 disposed between the multiple chamber module 202 and the wafer handling chamber 204 may comprise at least one sidewall, a base, and a ceiling enclosing a passageway between the multiple chamber module 202 and the wafer handling chamber 204. The first pyrometer 220A and the second pyrometer 220A may be disposed in the ceiling of the tunnel structure 206 such that the first optical path of the first pyrometer and the second optical path of the second pyrometer intercept the first transfer path and the second transfer path respectively. Since the optical paths of the two or more pyrometers intercept the transfer paths of the first and second substrates, the first and second pyrometers are positioned such that they are able to remotely measure the temperature of the first substrate 212A and the second substrate 212B as they are transferred between the multiple chamber module 202 and the wafer handling chamber 204. In some embodiments of the disclosure, the first pyrometer 220A and the second pyrometer 220B are disposed in the ceiling of the tunnel structure at fixed locations, i.e., such that the optical paths of the first pyrometer and the second pyrometer are also fixed in space.

To enable the thermal radiation from the substrates to propagate along the first and second optical paths and to reach the detection systems of at least the first pyrometer and the second pyrometer, the ceiling of the tunnel structure, in which the first and second pyrometers are disposed, may comprise one or more transparent windows through which the thermal radiation from the two or more substrates may be transmitted. FIG. 4 illustrates the first pyrometer 220A aligned with a first transparent window 228 disposed in the ceiling of the tunnel structure 206. Therefore, in some embodiments of the disclosure, the tunnel structure further comprises a first transparent window aligned with the first pyrometer and a second transparent window aligned with the second pyrometer. For example, the first transparent window and the second transparent window may be fabricated from quartz glass.

In some embodiments of the disclosure, the at least first pyrometer and the second pyrometer may be disposed at additional and/or alternative locations along the first transfer path and the second transfer path. For example, in some embodiments, the first and second pyrometers may be disposed in the ceiling of the multiple chamber module, as illustrated in FIG. 4, which illustrates a non-limiting example in which the first pyrometer 220A' is disposed in the ceiling of the first reaction chamber 208A such that the first optical path 226A' intercepts the first transfer path 214A at a location disposed between the first substrate support structure 216A and the tunnel structure 206. Likewise, a second pyrometer may be disposed in the ceiling of the second reaction chamber such that the second optical path intercepts the second transfer path at a location disposed between the second substrate support structure and the tunnel structure. In addition to, or alternatively, at least the first and second pyrometers may be disposed in the ceiling of the wafer handling chamber, as illustrated in FIG. 4, which illustrates a non-limiting example in which the first pyrometer 220A" is disposed in the ceiling of the wafer handling chamber 204 such that the first optical path 226A" intercepts the first transfer path 214A at a location disposed between the tunnel structure 206 and the end point of travel for the transfer robot into the wafer handling chamber 204. Likewise, a second pyrometer may be disposed in the ceiling of the wafer handling chamber such that the second optical path intercepts the second transfer path at a location disposed between the tunnel structure and the end point of travel for the transfer robot into the wafer handling chamber.

The first pyrometer 220A and the second pyrometer 200B may be configured to obtain a plurality of temperature measurements from the surface of two substrates simultaneously. In some embodiments of the disclosure, the first pyrometer and the second pyrometer may perform a temperature line scan across the upper exposed surface of the two substrates as they are transferred between the substrate support structures and the wafer handling chamber. For example and with reference to FIG. 3, the first pyrometer 220A may be positioned and configured such that the first optical path 226A (shown as the dashed line from above) of the first pyrometer 220A may intersect the first transfer path 214A at the center axis of the first transfer path 230A. In addition, in some embodiments, the second pyrometer 220B may be positioned and configured such that the second optical path 226B (shown as the dashed line from above) of the second pyrometer 220B intersects the second transfer path 214B at the center axis of the second transfer path 214B. Utilizing the first and second pyrometers to measure the temperature across the central axis of the two substrates simultaneously provides a temperature line scan of the two substrates as they are removed from the substrate support structures 216A and 216B. It should however be appreciated, that any number of pyrometers may be positioned to intersect the first and second transfer path, such that multiple temperature line scans may be measured across two or more substrates simultaneously.

In some embodiments of the disclosure, the first pyrometer 220A and the second pyrometer 220B may be electrically connected to a control system configured for simultaneously acquiring a plurality of temperature measurements from at least a first substrate and a second substrate. For example and with reference to FIG. 4, a control system 232 may be electrically connected to the first pyrometer 220A via an electrical connection 234. Likewise, the control system 200 may be electrically connected to the second pyrometer via an additional electrical connection. In some embodiments, the control system 232 may be utilized to acquire and store the temperature line scan data from the first substrate and the temperature line scan from the second substrate as the two substrates are simultaneously transferred from the first and second reaction chambers to the wafer handling chamber. In some embodiments of the disclosure, the control system 232 may be utilized to create a control chart to display the variation in the temperature of a plurality of substrates from multiple process runs (e.g., multiple deposition processes), such that variation in the temperature of the substrates as a function of the number of process runs may be utilized to determine the variation in the thermal environment within at least the first reaction chamber and the second reaction chamber of the multiple chamber module.

In some embodiments of the disclosure, the control system may be electrically connected to a first substrate heater disposed in the first reaction chamber and electrically connected to a second substrate heater disposed in the second reaction chamber, wherein the differential temperature between the plurality of temperature measurements from the first substrate and the second substrate is feedback to the first substrate heater and the second substrate heater to substantially match the temperature of a first substrate disposed within the first reaction chamber and a second substrate disposed within the second reaction chamber. For example and with reference to FIG. 4, the control system 232 may be electrically connected to the heating system 222 associated with the first substrate support structure 216A via electrical connection 236. Likewise, the control system 232 may be electrically connected to a heating system associated with the second substrate support structure 216B.

Figure 5:
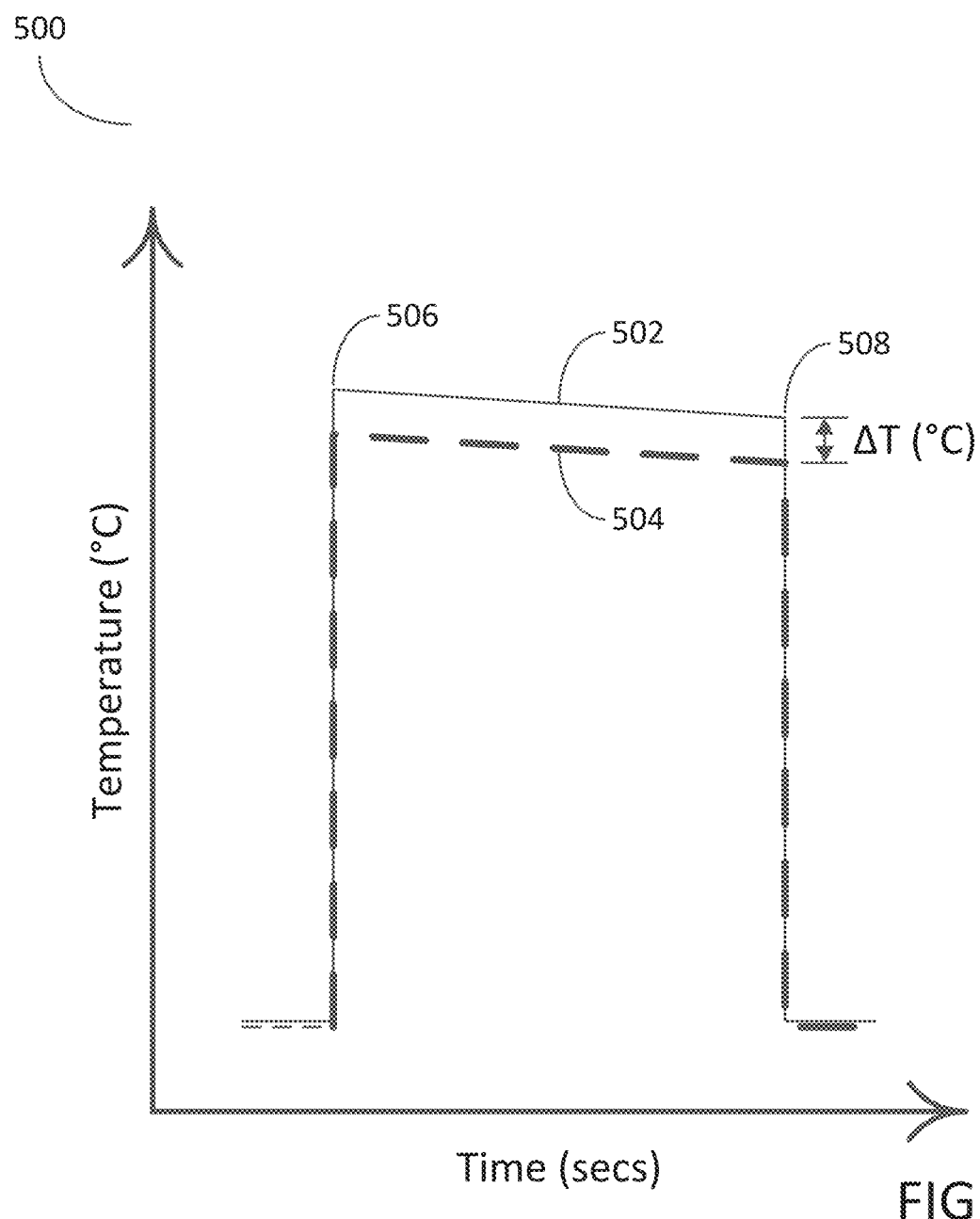
FIG. 5 is a graph illustrating two temperature line scans taken from a first substrate and a second substrate.

In some embodiments of the disclosure, the plurality of temperature measurements acquired from at least the first substrate and the second substrate may take the form as illustrated in FIG. 5, wherein data line 502 comprises the temperature line scan of a first substrate and data line 504 comprises the temperature line scan of a second substrate. For example, the first and second substrates may begin to cross the optical paths of the first and second pyrometers at the data point labelled 506 and the first and second substrates may exit the optical paths of the first and second pyrometer at the data point labelled 508. The control system 232 may be utilized to calculate the average differential temperature ($\Delta T$) between the first substrate and the second substrate and the average differential temperature ($\Delta T$) may be utilized by the control system 232 as a feedback signal to the heater systems associated with the first substrate support structure and the second substrate support structure. For example, the feedback signal provided by the control system 232 to the heater systems associated with the first substrate support structure and the second substrate support structure may be utilized to alter the power supplied to the heater systems such that the temperature of a first substrate disposed on the first substrate support structures is substantially matched to the temperature of a second substrate disposed on the second substrate support structure. Therefore, any variation in the thermal environment between the first reaction chamber and the second reaction chamber may be compensated for by the pyrometers, the control system and the heater systems associated with the first reaction chamber and the second reaction chamber. In addition, any variation of substrate temperature over time, for example, over a period of multiple process runs (e.g., over multiple deposition processes), may be monitored by the pyrometers and may be compensated for by the control systems and associated heater systems.

In some embodiments of the disclosure, rather than a semiconductor processing apparatus comprising a multiple chamber module, a chamber module may be utilized which comprises at least a first reaction chamber. For example, a chamber module may comprise a single reaction chamber and the embodiments of the disclosure may accordingly concern a chamber module comprising at least a first reaction chamber. In some embodiments, a substrate support may be disposed within the first reaction chamber and a wafer handling chamber comprising a transfer robot may be configured for transferring the substrate along a transfer path between the wafer handling chamber and the substrate support structure. In addition, the semiconductor processing apparatus may comprise at least a first pyrometer, wherein an optical path of the first pyrometer intersects the transfer path.

The embodiments of the current disclosure may also provide methods for monitoring and controlling a semiconductor processing apparatus and in particular for monitoring and controlling two or more reaction chambers associated with a multiple chamber module. In some embodiments of the disclosure a method of monitoring and controlling a semiconductor processing apparatus may comprise: heating two or more substrates to a process temperature in a multiple chamber module, transferring the two or more substrates from the multiple chamber module to a wafer handling chamber, and measuring the temperature of the two or more substrates concurrently with transferring the two or more substrates.

Figure 6:
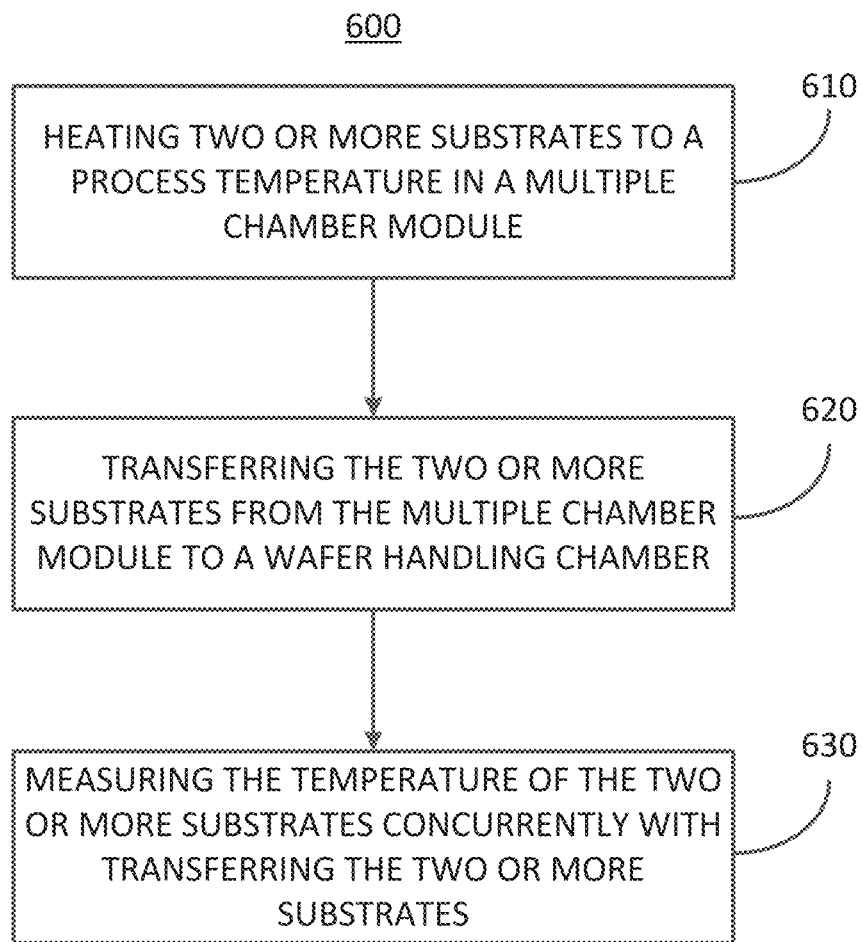
FIG. 6 is a process flow diagram for an exemplary method for monitoring and controlling the temperature of two or more reaction chambers associated with a multiple chamber module, according to the embodiments of the disclosure.

In more detail, FIG. 6 illustrates a process flow diagram for an exemplary method 600 utilized for monitoring and controlling a semiconductor processing apparatus. The method 600 may proceed with process block 610 which comprises, heating two or substrates to a process temperature in a multiple chamber module. As a non-limiting example, the multiple chamber module may comprise at least a first reaction and a second reaction. In some embodiments, the multiple chamber module may comprise a dual chamber module consisting of two reaction chambers. In some embodiments, the multiple chamber module may comprise, three or more reaction chambers, four or more reaction chamber, or even five or more reaction chambers. In some embodiments, the first reaction chamber and the second reaction chamber may be configured for atomic layer deposition processes. In some embodiments, the first reaction chamber and the second reaction chamber may be configured for chemical vapor deposition processes. In some embodiment, the first reaction chamber and the second reaction chamber may be configured for substrate cleaning processes. In some embodiments, the first reaction chamber and the second reaction may be nominally identical and configured for performing substantially identical semiconductor fabrication processes, such as, for example, substantially identical deposition processes, or substantially identical substrate cleaning processes.

Heating the two or more substrates to a process temperature may further comprise disposing a first substrate on a first substrate support structure within the first reaction chamber and disposing a second substrate on a second substrate support structure within the second reaction chamber. In some embodiments, the first substrate support structure comprises a first heating system, e.g., an electrical heater, for heating the first substrate to a desired process temperature. In some embodiments, the second substrate support structure comprises a second heating system for heating the second substrate to a desired process temperature. In some embodiments of the disclosure, heating the two or more substrates to a process temperature may further comprise heating a first substrate and a second substrate to substantially the same temperature.

The exemplary method 600 may continue with process block 620 comprising, transferring the two or more substrates from a multiple chamber module to a wafer handling chamber. In more detail, transferring the two or more substrates from the multiple chamber module to the wafer handling chamber may further comprise, simultaneously transferring the two or more substrates. For example, transferring the two more substrates may comprise utilizing a double-arm robot to simultaneously transfer a first substrate and a second substrate from the multiple chamber module to the wafer handling chamber.

In some embodiments of the disclosure, transferring the two or more substrates further comprises, transferring a first substrate along a first transfer path located between the first substrate support structure and the wafer handling chamber and transferring a second substrate along a second transfer path located between the second substrate support structure and the wafer handling chamber. In some embodiments, transferring the two or more substrates further comprises, transferring the two or more substrates through a tunnel structure disposed between the multiple chamber module and the wafer handling chamber. In some embodiments, transferring the two or more substrates through a tunnel structure further comprises, simultaneously transferring a first substrate and second substrate through a tunnel structure.

The exemplary method 600 may continue with process block 630 comprising, measuring the temperature of the two or more substrates concurrently with transferring the two or more substrates. In other words, as a first substrate and a second substrate are transferred from a first and a second reaction chamber, respectively, to a wafer handling chamber, the temperature of the first substrate and the temperature of the second substrate are measured. In some embodiments of the disclosure, measuring the temperature of the two or more substrates further comprises simultaneously measuring the temperature of the two or more substrates. In some embodiments, measuring the temperature of the two or more substrates may further comprise measuring the temperature of the two or more substrates utilizing at least a first pyrometer and a second pyrometer. In some embodiments of the disclosure, additional pyrometers may be utilized to measure the temperature of the two or more substrates, for example, measuring the temperature of the two or more substrates may further comprise measuring the temperature of the two or more substrate utilizing at least three pyrometers, or at least four pyrometers, or at least five pyrometers, or even at least six pyrometers.

In some embodiments of the disclosure, measuring the temperature of the two or more substrates may further comprise, positioning a first optical path of a first pyrometer to intersect the first transfer path and positioning a second optical path of a second pyrometer to intersect the second transfer path. In more detail, a pyrometer includes an optical system configured for focusing radiation onto the detection system enclosed within the pyrometer. For example, in some embodiments, the optical system of an individual pyrometer may be configured to receive infrared energy, emitted from a circular spot on a target surface, and focus said infrared energy onto the detection system. The path between the target surface to be measured and the pyrometer may be referred to as the optical path. Therefore, in order to measure the temperature of a substrate being transferred between a multiple chamber module and a wafer handling chamber, the optical paths of the two more pyrometers need to intercept the transfer paths of the two or more substrates.

In some embodiments of the disclosure, positioning the optical path of the first pyrometer to intersect the first transfer path further comprises positioning the first optical path at the center axis of the first transfer path. In addition, in some embodiments, positioning the second optical path of the second pyrometer to intersect the second transfer path further comprises positioning the second optical path at the center axis of the second transfer path. For example, positioning the optical path of a pyrometer such that it is aligned with the center axis of a transfer path means that the pyrometer may be utilized to measure a temperature line scan across the central axis of the substrate.

In some embodiments of the disclosure, measuring the temperature of the two or more substrates utilizing at least a first pyrometer and a second pyrometer may further comprise disposing the first pyrometer and the second pyrometer in a ceiling of a tunnel structure disposed between the multiple chamber module and the wafer handling chamber. In addition to, and/or alternatively, utilizing at least a first pyrometer and a second pyrometer to measure the temperature of two or more substrate may further comprise disposing the first pyrometer and the second pyrometer in a ceiling of the multiple chamber module. In addition to, and/or alternatively, utilizing at least a first pyrometer and second pyrometer to measure the temperature of the two or more substrates may further comprise disposing the first pyrometer and the second pyrometer in a ceiling of the wafer handling chamber.

As previously stated, measuring the temperature of the two or more substrate may comprise simultaneously measuring the temperature of the two or more substrates. In addition, in some embodiments, simultaneously measuring the temperature of the two or more substrates may further comprise measuring a plurality of temperature data along a central axis of a first substrate and along a central axis of a second substrate. In some embodiments, simultaneously measuring the temperature of the two or more substrates may further comprise measuring a plurality of temperature data from a front surface of a first substrate and from a front surface of a second substrate.

The methods of the disclosure may also comprise, acquiring and storing the plurality of temperature data from the first substrate and the second substrate utilizing a control system associated with the semiconductor processing apparatus. For example, as a non-limiting example embodiment, the plurality of temperature data acquired by the control system, from at least a first substrate and a second substrate, may be utilized to calculate an average differential temperature between the first substrate and the second substrate.

In more detail, as a non-limiting example embodiment, the multiple chamber module may comprise at least a first reaction chamber and a second reaction chamber configured for performing identical process recipes. For example, the control system associated with the semiconductor processing apparatus may store and execute identical process recipes in the first reaction chamber and the second reaction chamber, i.e., the process recipes may include identical pressure set points, gas flow set points, gas exposure times, and particularly identical substrate temperature set points. The identical process recipes, performed in the first reaction chamber and the second reaction chamber, should ideally result in identical temperature measurements from the first pyrometer and the second pyrometer as the first substrate and the second substrate are transferred from the respective reaction chambers to the wafer handling chamber. Any differential temperature observed in the temperature data acquired from the first substrate and the second substrate may indicate a difference in the thermal environment between the first reaction chamber and the second reaction chamber and the embodiments of the disclosure may be utilized to compensate for such a difference in the thermal environments. Therefore, in some embodiments of the disclosure, the methods of monitoring and controlling a semiconductor processing apparatus may further comprise, feeding back the differential temperature to a first heater disposed with a first reaction chamber and to a second heater disposed within a second reaction chamber and substantially matching the temperature of a first substrate disposed within the first reaction chamber and a second substrate disposed within the second reaction chamber. Consequently, any variation between a first reaction chamber and a second reaction chamber may be compensated for and the temperature of the first substrate and the second substrate may be substantially the same for a given substrate temperature set point.

In some embodiments of the disclosure, the methods disclosed herein may concern a semiconductor processing apparatus comprising a chamber module which comprises at least a first reaction chamber. For example, a chamber module may comprise a single reaction and the methods of the disclosure may accordingly concern a chamber module comprising at least a first reaction chamber. Therefore, some embodiments of disclosure may comprise a method of monitoring and controlling a semiconductor apparatus further comprising, heating a substrate to a process temperature in a chamber module, transferring the substrate from the chamber module to a wafer handling chamber, and measuring the temperature of the substrate concurrently with transferring the substrate.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method of monitoring and controlling a semiconductor processing apparatus, comprising:
    transferring a first substrate along a first transfer path through a tunnel structure between a wafer handling chamber and a first reaction chamber in a multiple chamber module, wherein the first path comprises a first length, wherein the tunnel structure is coupled to and spans between the wafer handling chamber and the multiple chamber module;
    transferring a second substrate along a second transfer path through the tunnel structure between the wafer handling chamber and a second reaction chamber in the multiple chamber module, wherein the second path comprises a second length,
    wherein the first substrate is transferred along the first transfer path substantially simultaneously with the second substrate being transferred along the second transfer path by a double-arm transfer robot,
    wherein the first transfer path and the second transfer path are separate parallel paths through the tunnel structure, and wherein the first length of the first transfer path and the second length of the second transfer path are equal;
    measuring a first temperature across the first substrate during the transferring the first substrate along the first transfer path by a first pyrometer coupled to the tunnel structure, wherein a first optical path of the first pyrometer intersects the first transfer path within the tunnel structure;
    measuring a second temperature across the second substrate during the transferring the second substrate along the second transfer path by a second pyrometer coupled to the tunnel structure, wherein a second optical path of the second pyrometer intersects the second transfer path within the tunnel structure,
    wherein the first pyrometer and the second pyrometer are positioned parallel to each other in terms of their positions along the respective transfer paths such that the first pyrometer and the second pyrometer substantially simultaneously measure the first temperature and the second temperature, respectively, as the transfer robot substantially simultaneously transfers the first substrate and the second substrate; and
    comparing the first temperature and the second temperature.

2. The method of claim 1, further comprising detecting a differential between the first temperature and the second temperature.

3. The method of claim 2, further comprising:
    feeding back the differential to a first heater comprised in the first reaction chamber and a second heater comprised in the second reaction chamber; and
    adjusting at least one of the first heater or the second heater to compensate for the differential.

4. The method of claim 1, wherein the substantially simultaneous measuring of the first temperature and the second temperature further comprises acquiring a plurality of temperature data from a front surface of the first substrate and from a front surface of the second substrate and storing the plurality of temperature data utilizing a control system associated with the semiconductor processing apparatus.

5. The method of claim 4, further comprising calculating an average differential temperature between the first substrate and the second substrate.

6. The method of claim 5, further comprising feeding back the average differential temperature to a first heater disposed within a first reaction chamber and to a second heater disposed within a second reaction chamber and substantially matching the temperatures of substrates disposed within the first reaction and the second reaction chamber.

7. The method of claim 1, wherein the first transfer path and the second transfer path are linear.

8. The method of claim 1, wherein the first substrate is transferred along the first transfer path, and the second substrate is transferred along the second transfer path, after processing of the first substrate and the second substrate.

9. The method of claim 1, wherein the first optical path of the first pyrometer intersects the first transfer path at a first center axis, and wherein the second optical path of the second pyrometer intersects the second transfer path at a second center axis.

10. The method of claim 1, wherein first pyrometer measures the first temperature of the first substrate at a first position on the first substrate that is substantially identical to a second position on the second substrate at which the second pyrometer measures the second temperature of the second substrate.

11. A method, comprising:
transferring a first substrate along a first transfer path through a tunnel structure between a wafer handling chamber and a first reaction chamber in a multiple chamber module, wherein the first path comprises a first length, wherein the tunnel structure is coupled to and spans between the wafer handling chamber and the multiple chamber module;
transferring a second substrate along a second transfer path through the tunnel structure between the wafer handling chamber and a second reaction chamber in the multiple chamber module, wherein the second path comprises a second length,
wherein the first substrate is transferred along the first transfer path substantially simultaneously with the second substrate being transferred along the second transfer path,
wherein the first transfer path and the second transfer path are separate paths through the tunnel structure, and wherein the first length of the first transfer path and the second length of the second transfer path are equal;
measuring a first temperature of the first substrate during the transferring the first substrate along the first transfer path by a first pyrometer coupled to the tunnel structure, wherein a first optical path of the first pyrometer intersects the first transfer path within the tunnel structure;
measuring a second temperature of the second substrate during the transferring the second substrate along the second transfer path by a second pyrometer coupled to the tunnel structure, wherein a second optical path of the second pyrometer intersects the second transfer path within the tunnel structure,
wherein the first pyrometer and the second pyrometer substantially simultaneously measure the first temperature and the second temperature, respectively, during the transferring the first substrate and the transferring the second substrate; and
comparing the first temperature and the second temperature.

12. The method of claim 11, further comprising detecting a differential between the first temperature and the second temperature.

13. The method of claim 12, further comprising:
feeding back the differential to a first heater comprised in the first reaction chamber and a second heater comprised in the second reaction chamber; and
adjusting at least one of the first heater or the second heater to compensate for the differential.

14. The method of claim 11, wherein the first transfer path and the second transfer path are linear.

15. The method of claim 11, wherein first pyrometer measures the first temperature of the first substrate at a first position on the first substrate that is substantially identical to a second position on the second substrate at which the second pyrometer measures the second temperature of the second substrate.

16. A method, comprising:
transferring a first substrate along a first transfer path through a tunnel structure between a wafer handling chamber and a first reaction chamber in a multiple chamber module, wherein the first path comprises a first length, wherein the tunnel structure is coupled to and spans between the wafer handling chamber and the multiple chamber module;
transferring a second substrate along a second transfer path through the tunnel structure between the wafer handling chamber and a second reaction chamber in the multiple chamber module, wherein the second path comprises a second length,
wherein the first substrate is transferred along the first transfer path substantially simultaneously with the second substrate being transferred along the second transfer path,
wherein the first transfer path and the second transfer path are separate paths through the tunnel structure, and wherein the first length of the first transfer path and the second length of the second transfer path are equal;
measuring a first temperature of a first substrate point on the first substrate during the transferring the first substrate along the first transfer path by a first pyrometer coupled to the tunnel structure, wherein a first optical path of the first pyrometer intersects the first substrate point on the first substrate;
measuring a second temperature of a second substrate point on the second substrate during the transferring the second substrate along the second transfer path by a second pyrometer coupled to the tunnel structure, wherein a second optical path of the second pyrometer intersects the second substrate point,
wherein the first pyrometer and the second pyrometer are positioned such that the first pyrometer and the second pyrometer substantially simultaneously measure the first temperature and the second temperature, respectively, during the transferring the first substrate and the transferring the second substrate; and
comparing the first temperature and the second temperature.

17. The method of claim 16, further comprising detecting a differential between the first temperature and the second temperature.

18. The method of claim 17, further comprising:
feeding back the differential to a first heater comprised in the first reaction chamber and a second heater comprised in the second reaction chamber; and
adjusting at least one of the first heater or the second heater to compensate for the differential.

19. The method of claim 16, wherein the first transfer path and the second transfer path are linear.

20. The method of claim 16, wherein the first substrate point on the first substrate is located at a first position on the first substrate that is substantially identical to a second position of the second substrate point on the second substrate.

* * * * *